United States Patent

[11] 3,593,173

[72] Inventor Sarkis Nercessian
Long Island City, N.Y.
[21] Appl. No. 787,776
[22] Filed Dec. 30, 1968
[45] Patented July 13, 1971
[73] Assignee Forbro Design Corp.
New York, N.Y.

[54] INPUT LIMITING FOR BIPOLAR OPERATIONAL TRANSISTOR AMPLIFIER
8 Claims, 4 Drawing Figs.

[52] U.S. Cl. .......... 330/25, 330/24, 330/69
[51] Int. Cl. .......... H03f 1/02, G06g 7/12
[50] Field of Search .......... 330/9, 24, 69, 185, 25; 332/9 T

[56] References Cited
UNITED STATES PATENTS

| | | | |
|---|---|---|---|
| 2,976,496 | 3/1961 | Hakimoglu .......... | 332/9 X |
| 3,426,245 | 2/1969 | Yurasek et al. .......... | 315/27 |

*Primary Examiner*—Nathan Kaufman
*Attorney*—Alfred W. Barber

ABSTRACT: Two pairs of back-to-back diodes one pair from each input terminal of an operational amplifier to a floating neutral provides input voltage limiting in a bipolar amplifier. A resistor in series with each pair of diodes provides current limiting to the voltage limiting diodes.
There are not related applications on file.

INVENTOR.
SARKIS NERCESSIAN
BY
Alfred W. Barber
ATTORNEY

INPUT LIMITING FOR BIPOLAR OPERATIONAL TRANSISTOR AMPLIFIER

BACKGROUND OF THE INVENTION

1. Field of the Invention

The present invention falls within Class 330, Amplifiers and Sub-class 25, (Transistor). Having DC feedback bias control for stabilization.

2. Description of Prior Art

Since an operational amplifier normally operates with a very small voltage (theoretically zero for an amplifier with infinite gain) across its input terminals it can be protected from dangerous voltage surges by placing a diode across these terminals without substantial affect on the normal operation of the amplifier. However, diodes connected in this manner must also be protected from excessive surge currents. This may be accomplished by adding a resistor in series. However, a single resistor and a single pair of back-to-back diodes cannot protect an amplifier in both polarity modes of input voltage. If the inverting input is resistor-diode protected, the noninverting input is unprotected from high voltage surges.

SUMMARY

In accordance with the present invention two pairs of back-to-back diodes are connected from the input terminals to a floating neutral, one pair from the inverting input terminal and the other pair from the noninverting input terminal. In addition a current limiting resistor is connected in series with each pair of diodes to protect them from excessive current surges. These additions to an operational amplifier provide an inverting input terminal, a noninverting input terminal and a neutral terminal for external circuit connections. When these latter three terminals are used, the amplifier functions in a normal manner with almost any form of external circuit and common mode voltage may be applied without modification but at the same time the amplifier is protected from input voltage surges of either polarity. The significance of the invention is the protection provided for almost any external circuit configuration and without adversely affecting the normal operation of the amplifier including its tolerance of common mode voltage.

BRIEF DESCRIPTION OF THE DRAWING

FIG. 1 is a schematic circuit diagram partly in block form of a prior art method of protecting the input circuit of an operational amplifier. For purposes of explanation the amplifier may be considered as being composed of two functional portions, namely, voltage amplifier 1 and power amplifier 2. Amplifier 1 has a noninverting input terminal 3, an inverting 4 terminal 4 and an output terminal 5. Power amplifier 2 has an inverting input 6, a noninverting input 7 and an output 8. For purposes of illustration, power amplifier 2 is shown with a load 9 shunted by a capacitor 10 and both returned to common line 11. A feedback resistor 12 is connected from output terminal 8 through resistor 13 to input terminal 3 providing degenerative feedback. Output terminal 5 is connected to input terminal 6 and terminals 4 and 7 are returned to common line 11. A source of input signal 18 is connected to input terminal 4 and through resistor 13 to input terminal 3. The circuit so far described comprises a conventional operational amplifier circuit including a noninverting voltage amplifier and an inverting power amplifier with a capacitor 10 across the load and resistor 13 in series with the input. Now, it can be seen that if feedback resistor 12 is suddenly shorted by closing switch 19–20 that any charge on capacitor 10 will be discharged through the input of amplifier 1 across terminals 3 and 4. The addition of back-to-back diodes 14–15 and 16–17 across terminals 3 and 4 will provide low impedance paths of either polarity preventing any voltage buildup greater than the forward conduction voltage of either of these diodes. Resistor 13 is chosen to limit the current through the diodes to a safe value. For example, if capacitor 10 can be charged to 500 volts, if resistor 13 is chosen as 500 ohms, the maximum discharge current through the diodes will be 1 ampere.

FIG. 2 is also a prior art configuration similar to that shown in FIG. 1 and bearing similar numerals. The difference is that in FIG. 2, amplifier 1 is connected as an inverting amplifier while amplifier 2 is connected as a noninverting amplifier. Now, if capacitor 10 discharges to the input of amplifier 1 as a result of closing switch 19–20, a large voltage drop can appear across resistor 13 which will cause a large voltage to appear between input terminal 3 and common line 11. Since generally operational amplifiers have quite limited input voltage tolerance, this large voltage can well be damaging or even destructive to the amplifier.

It is the purpose of the present invention to provide input voltage and current protection for operational amplifiers to be used in circuits where input voltage or current may be present in sufficient magnitude to damage the amplifier. Particularly, it is the purpose of the present invention to provide methods of and means for this protection in whatever mode the amplifier is connected in the circuit.

Figure 1:
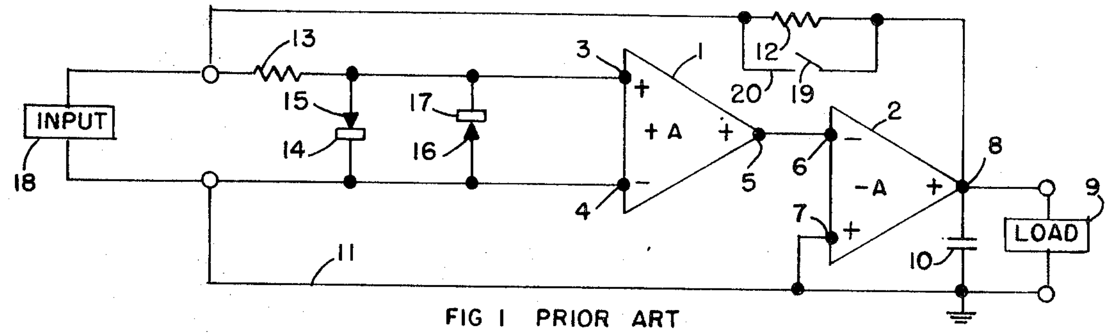
FIG 1 PRIOR ART
FIGS. 1 and 2 are prior art protective circuits.
Figure 2:
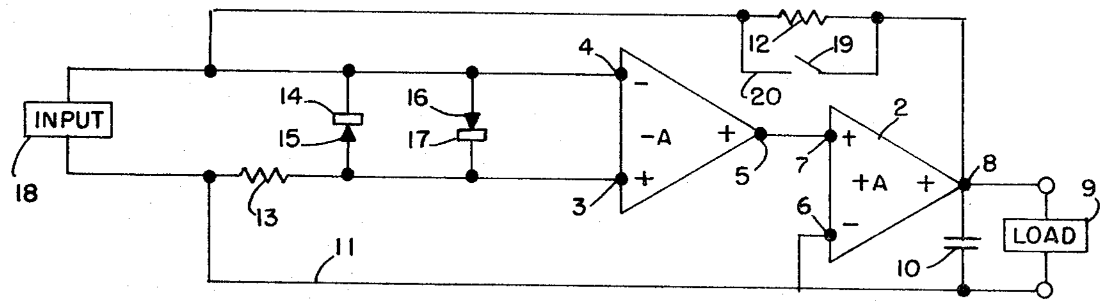
FIG 2 PRIOR ART
Figure 3:
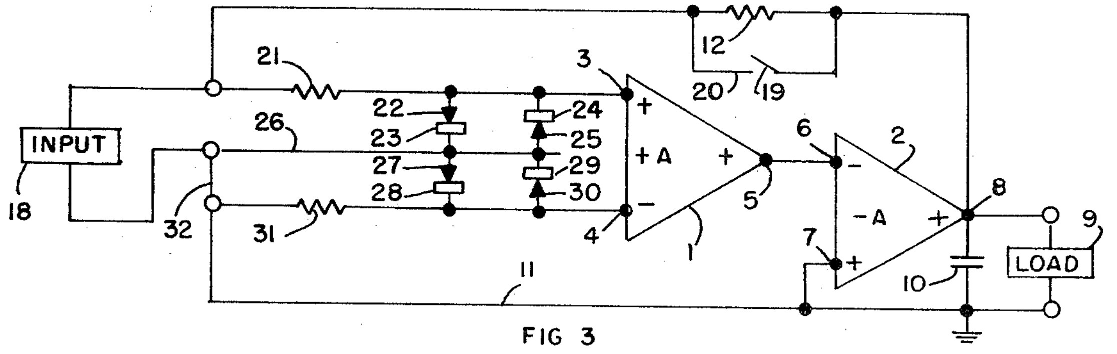
FIG. 3 is a schematic circuit of the present invention applied to a noninverting amplifier followed by an inverting amplifier.

FIG. 3 is a schematic circuit diagram embodying one form of the present invention illus...ed in one mode of operation. The essence of the invention is the two pair of back-to-back diodes and current limiting resistors provided across the inputs to the voltage amplifier 1. The feedback through resistor 12 is connected through current limiting resistor 21 to input terminal 3 of voltage amplifier 1. A current limiting resistor 31 is connected between input terminal 4 and common line 11. An added neutral line 26 is provided. One pair of back-to-back connected diodes 22–23 and 24–25 is connected from input terminal 3 and this neutral line 26. A second pair of back-to-back diodes 27–28 and 29–30 is connected from input terminal 4 to neutral line 26. Current limiting resistor 21 is provided in series with the first pair of diodes and current limiting resistor 31 is provided in series with the second pair. Neutral line 26 is connected to current limiting resistor 31 and common line 11 by means of lead 32 and input 18 is connected between the ends of resistors 21 and 31 remote from the amplifier input terminals. Now, it can be seen that if switch 19–20 across feedback resistor 12 is closed while capacitor 10 is charged by output from amplifier 2 that it will discharge through current limiting resistor 21 and across voltage limiting back-to-back diodes 22–23, 24–25 and thereby protecting amplifier 1 from excessive input voltage or current.

Figure 4:
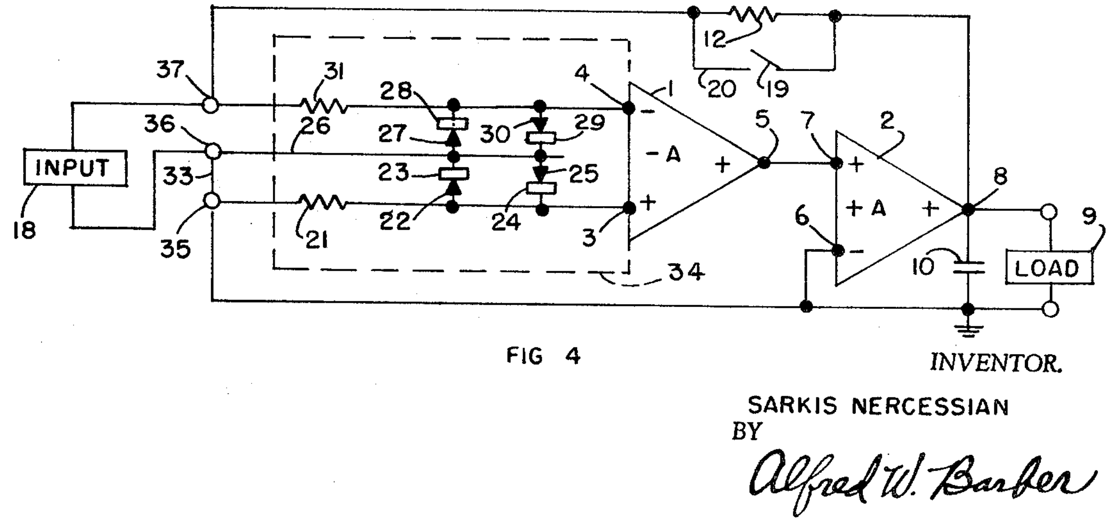
FIG. 4 is a schematic circuit of the present invention applied to an inverting amplifier followed by a noninverting amplifier.

FIG. 4 shows how the circuit of the present invention also applies to the alternate connection of the amplifiers where the input is applied to input terminal 4 and amplifier 2 is a noninverting amplifier. In this configuration the feedback from output terminal 8 through feedback resistor 12 is through resistor 31 to input terminal 4. Upon closing switch 19–20 capacitor 10 discharges through resistor 31 and diodes 27–28, 29–30 and over leads 33 to common line 11. Input 18 is connected between resistor 31 and neutral line 26. Thus, the input of amplifier 1 is protected from excessive voltage by back-to-back diodes 27–28 and 29–30 and these diodes are protected from excessive current by resistor 31.

Thus, the combination of two pairs of back-to-back voltage limiting diodes and two current limiting resistors have been provided for protecting an operational amplifier including a power stage from excessive feedback current and voltage which could damage the amplifier if applied to the input without such protection.

While only one form of the present invention has been shown and described, modifications may be apparent to those skilled in the art and within the spirit and scope of the invention as set forth, in particular, in the appended claims.

I claim:

1. In an operational amplifier, the combination of;

an operational amplifier including an inverting input terminal, a noninverting input terminal and an output terminal;

a neutral terminal;

a pair of back-to-back diodes connected between said inverting input terminal and said neutral terminal;

a pair of back-to-back diodes connected between said noninverting input terminal and said neutral terminal;

a current limiting resistor connected between said inverting input terminal and a third input terminal;

a current limiting resistor connected between said noninverting input terminal and a fourth input terminal;

a connection between said neutral terminal and said third terminal;

a source of input signal connected between said neutral terminal and said fourth terminal;

and feedback circuit means coupled between said output terminal and fourth terminal;

whereby input voltage and current to said amplifier are limited from said feedback circuit in the presence of shunting of said feedback means.

2. An operational amplifier as set forth in claim 1;

and including a noninverting power amplifier coupled to said output terminal;

a load shunted by energy storage means coupled to said power amplifier;

wherein said feedback circuit means comprises a feedback resistor;

and switch means for shorting said feedback resistor connected in shunt with said feedback resistor.

3. An operational amplifier as set forth in claim 1;

wherein both sets of back-to-back diodes and both of said current limiting resistors are packaged in a container along with said operational amplifier.

4. An operational amplifier as set forth in claim 1;

and including noninverting power amplifying means coupled to a capacitive load.

5. An operational amplifier as set forth in claim 1;

wherein said current limiting resistors are of sufficient resistance to limit the current to said diodes to a safe value.

6. In an operational amplifier the combination of;

an operational amplifier including an inverting input terminal, a noninverting input terminal and an output terminal;

a neutral terminal;

a pair of back-to-back diodes connected between said inverting input terminal and said neutral terminal;

a pair of back-to-back diodes connected between said noninverting input terminal and said neutral terminal;

a current limiting resistor connected between said inverting input terminal and a third input terminal;

a current limiting resistor connected between said noninverting input terminal and a fourth input terminal;

a connection between said neutral terminal and said fourth terminal;

a source of input signal connected between said neutral terminal and said third terminal;

and feedback circuit means coupled between said output terminal and said third terminal;

whereby input voltage and current to said amplifier are limited from said feedback circuit in the presence of shunting of said feedback means.

7. An operational amplifier as set forth in claim 6;

and including a noninverting power amplifier coupled to said output terminal;

a load shunted by energy storage means coupled to said power amplifier;

wherein said feedback circuit means comprises a feedback resistor;

a switch means for shorting said feedback resistor connected in shunt with said feedback resistor.

8. An operational amplifier as set forth in claim 6;

wherein both sets of back-to-back diodes and said current limiting resistors are packaged in a container along with said operational amplifier.